(12) United States Patent
Hikita

(10) Patent No.: US 7,315,058 B2
(45) Date of Patent: Jan. 1, 2008

(54) SEMICONDUCTOR MEMORY DEVICE HAVING A FLOATING GATE

(75) Inventor: Tsuneaki Hikita, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/515,000

(22) Filed: Sep. 5, 2006

(65) Prior Publication Data

US 2007/0052006 A1 Mar. 8, 2007

(30) Foreign Application Priority Data

Sep. 8, 2005 (JP) ............................. 2005-260383

(51) Int. Cl.
*H01L 29/788* (2006.01)

(52) U.S. Cl. .................. 257/316; 257/314; 257/315; 257/E21.682

(58) Field of Classification Search ................ 257/295, 257/314–319; 438/257–258, 593–594

See application file for complete search history.

(56) References Cited

U.S. PATENT DOCUMENTS 6,291,297 B1 * 9/2001 Chen .......................... 438/265

6,894,339 B2 * 5/2005 Fan et al. .................... 257/314
2005/0029577 A1 2/2005 Nishizaka et al.

FOREIGN PATENT DOCUMENTS

JP 11-354742 12/1999
JP 3249811 11/2001

* cited by examiner

*Primary Examiner*—Dung A. Le
(74) *Attorney, Agent, or Firm*—McGinn IP Law Group, PLLC

(57) ABSTRACT

To prevent the extraction of electrons from the floating gate during a read operation. A semiconductor memory device comprises a selection gate 3a provided in a first region on a substrate 1 through an insulating film 2, a floating gate 6a provided in a second region adjacent to the first region through an insulating film 5, a first and second diffusion regions 7a and 7b provided in a third region adjacent to the second region, and a control gate 11 provided over the floating gate 6a through an insulating film 8, the control gate 11 intersects with the selection gate 3a at different levels, a third diffusion region 21 is provided in a fourth region located near an extending part of the selection gate 3a on the surface of the substrate, the floating gate 6a is formed in the form of a side wall, and it has a round part 6b at the top on the side directed to the side wall surface of the selection gate 3a.

19 Claims, 14 Drawing Sheets

(READ OPERATION)

SEMICONDUCTOR MEMORY DEVICE HAVING A FLOATING GATE

FIELD OF THE INVENTION

The present invention relates to a semiconductor memory device having a cell transistor and a method for manufacturing the same and particularly to a semiconductor memory device storing multiple bits of information per cell and a method for manufacturing the same.

BACKGROUND OF THE INVENTION

Among conventional semiconductor memory devices, a nonvolatile semiconductor memory device having a cell transistor shown in FIG. 5 is known as a nonvolatile semiconductor memory device storing multiple bits of information per cell (Related Art 1). The nonvolatile semiconductor memory device relating to Related Art 1 comprises two band (or strap)-shaped opposite conductivity type regions 123a and 123b formed on the surface of a semiconductor substrate 121 with a band-shaped semiconductor layer 124a of one conductivity type interposed between them, a first floating gate 127a formed on one of the opposite conductivity type regions 123a and a side surface of the semiconductor layer 124a via an insulating film 122a, a second floating gate 127b formed on the other opposite conductivity type region 123b and the other side surface of the semiconductor layer 124a via an insulating film 122b, and a control gate 130a formed on the upper surface of the semiconductor layer 124a via an insulating film 128 (refer to Patent Document 1). The nonvolatile semiconductor memory device relating to Related Art 1 has a highly reliable structure, maintains the localization of the trapped charges even when excessive write operations are performed, and is able to control the dispersion of the threshold voltage. Furthermore, since the floating gates 127a and 127b and the opposite conductivity regions 123a and 123b overlap, it can be miniaturized to such an extent.

A nonvolatile semiconductor memory device shown in FIGS. 6 and 7 is also known as a conventional semiconductor memory device (Related Art 2). The nonvolatile semiconductor memory device relating to Related Art 2 comprises a first diffusion region 207a and a second diffusion region 207b extending in parallel to one another and apart from one another in a memory cell area on the surface of a substrate 201, a selection gate 203a disposed in a region between the first diffusion region 207a and the second diffusion region 207b on the substrate 201 through an insulating film 202, a third diffusion region (221 in FIG. 6) extending in the direction orthogonal to the direction of the selection gate 203a and provided on the surface of the substrate 201 below the selection gate 203a outside the cell region, floating gates 206a disposed in a first region between the first diffusion region 207a and the selection gate 203a and in a second region between the second diffusion region 207b and the selection gate 203a via (interposed with) the insulating film 202, and a plurality of control gates 211 each disposed over the floating gates 206a and the selection gate 203a via an insulating film 208. The first diffusion region 207a, the floating gate 206a, the control gate 211, and the selection gate 203a make up a first unit cell; whereas the second diffusion region 207b, the floating gate 206a, the control gate 211, and the selection gate 203a make up a second unit cell. An inversion layer 220 is created on the surface of the substrate 201 below the selection gate 203a within the cell region by applying a positive voltage to the selection gate 203a (refer to Patent Document 2). The nonvolatile semiconductor memory device relating to Related Art 2 is different from the nonvolatile semiconductor memory device relating to Related Art 1 in the following points: (1) it has the selection gate 203; (2) the inversion layer 220 is formed below the selection gate 203a in the cell region when a positive voltage is applied to the selection gate 203a; (3) the space below each of the floating gates 206a is utilized as a channel; (4) the inversion layers 220 and the third diffusion regions (221 in FIG. 6) are used as current supplying paths on the drain side during read operations.

Compared to the nonvolatile semiconductor memory device relating to Related Art 1, the channel below the selection gate 203a is positioned at a drain side when reading is performed in the nonvolatile semiconductor memory device relating to Related Art 2. Thus, reading from a target storage node of an independent unit cell disposed opposite to a nontarget storage node with the selection gate 203a interposed between them is performed without recourse to the nontarget storage node of the other unit cell. This semiconductor memory device substantially functions as a one-bit cell, therefore, it is advantageous for obtaining stable circuit operation.

A method for manufacturing the nonvolatile semiconductor memory device relating to Related Art 2 will be described with reference to the drawings. FIGS. 8A to 11L illustrate cross sectional views schematically showing the steps of the method for manufacturing the nonvolatile semiconductor memory device relating to Related Art 2.

First, after an element isolation region (not shown in the drawings) is formed on the substrate 201, a well (not shown in the drawings) is created in the cell region on the substrate 201. Then, the third diffusion region (221 in FIG. 6) is formed and the insulating film 202 (for instance a silicon oxide film) is formed on the substrate 201. A selection gate film 203 (for instance a polysilicon film) is formed over the insulating film 202, and an insulating film 210 (for instance a silicon oxide film) is formed over the selection gate film 203. An insulating film 204 (for instance a silicon nitride film) is formed over the insulating film 210, an insulating film 212 (for instance a silicon oxide film) is formed over the insulating film 204, and an insulating film 213 (for instance a silicon nitride film) is formed over the insulating film 212 (step A1; refer to FIG. 8A). Next, a photoresist (not shown in the drawings) is formed over the insulating film 213 for forming the selection gate 203a. The selection gate 203a is formed by selectively etching the insulating film 213, the insulating film 212, the insulating film 204, the insulating film 210, the selection gate (203 in FIG. 8A), and the insulating film 202 using this photoresist as a mask, and then the photoresist is removed (step A2; refer to FIG. 8B). Next, an insulating film 205 (for instance a silicon oxide film) is formed over the entire surface of the substrate (step A3; refer to FIG. 8C).

Next, a floating gate film 206 (for instance a polysilicon film) is deposited over the entire surface of the substrate (step A4; refer to FIG. 9D). Then the floating gate film 206a in the form of side wall is formed on side wall surfaces of the insulating film 202, the selection gate 203a, the insulating film 204, the insulating film 212, and the insulating film 213 by etching back the floating gate film (206 in FIG. 9D) (step A5; refer to FIG. 9E). Next, the first diffusion region 207a and the second diffusion region 207b are formed by ion implantation in the self alignment manner, using the insulating film 205 and the floating gate 206a as a mask (step A6; refer to FIG. 9F).

Next, an insulating film 209 (for instance a CVD silicon oxide film) is deposited over the entire surface of the substrate (step A7; refer to FIG. 10G). Then the insulating film 209 is leveled (flattened) by the CMP method using the insulating film 213 as a stopper (the insulating film 205 over the insulating 213 is removed) (step A8; refer to FIG. 10H). Next, the insulating film 209 is partially and selectively removed (step A9; refer to FIG. 10I).

Then the insulating film (213 in FIG. 10F) is selectively removed (step A10; refer to FIG. 11J). Next, the insulating film 212 (including parts of the insulating film 205 and the insulating film 209) is selectively removed (step A11; refer to FIG. 11K). Note that parts of the insulating film 209 and the insulating film 205 are removed when the insulating film 212 is removed. Then the insulating film 208 (for instance an ONO film) is formed over the entire surface of the substrate (step A12; refer to FIG. 11L).

Then a control gate film (for instance a polysilicon film) is deposited over the entire surface of the substrate, a photoresist (not shown in the drawings) for forming a word line is formed, the band-shaped control gates 211 and the insular floating gates 206a are formed by selectively removing the control gate film, the insulating film 208, and the floating gate 206a using this photoresist as a mask, and then the photoresist is removed (step A13; refer to FIG. 7). Thus the semiconductor memory device having a memory cell is completed.

The read operation of the nonvolatile semiconductor memory device relating to Related Art 2 will be described with reference to the drawings. FIG. 12 is a schematic diagram for explaining the read operation of the semiconductor memory device relating to Related Art 2 (the read operation in a state where electrons are not accumulated in the floating gate).

Referring to FIG. 12, during the read operation in the state where electrons are not accumulated in the floating gate 206a (erase state; low threshold voltage, ON cell), electrons e run from the second diffusion region 207b through the channel below the floating gate 206a when a positive voltage is applied to the control gate 211, the selection gate 203a, and the third diffusion region (221 in FIG. 6). The electrons e further run through the inversion layer 220 formed below the selection gate 203a and move to the third diffusion region (221 in FIG. 6). On the other hand, in a state where electrons are accumulated in the floating gate 206a (a write state; high threshold voltage, OFF cell), the electrons e do not flow when a positive voltage is applied to the control gate 211, the selection gate 203a, and the third diffusion region (221 in FIG. 6) because there is no channel below the floating gate 206a (not shown in the drawing). The read operation is performed by judging data (0/1) according to whether or not the electrons e flow.

[Patent Document 1]
Japanese Patent No. 3249811
[Patent Document 2]
U.S. Patent Publication No. US2005-0029577A1
[Patent Document 3]
Japanese Patent Kokai Publication No. JP-A-11-354742
The entire disclosures of the documents mentioned above are incorporated herein with reference thereto.

SUMMARY OF THE DISCLOSURE

In the manufacturing method of the nonvolatile semiconductor memory device relating to Related Art 2, the floating gate 206a is formed in the form of a side wall since it is formed by etching back (refer to FIG. 9E) and the floating gate 206a has a steep edge 206b at the top edge on the side directed to the side wall surface of the insulating film 204 (refer to FIG. 7). When the floating gate 206a has such an edge at the top of the floating gate, the electric field of a low voltage applied to the control gate 211 during a read operation concentrates at the edge of the floating gate 206a (refer to FIG. 13), and electrons are extracted from (pulled out of) the floating gate to the control gate (refer to FIG. 14). The operational reliability may suffer as a result.

It is an object of the present invention to prevent the extraction of electrons from the floating gate during a read operation. Other objects will become apparent in the entire disclosure.

According to a first aspect of the present invention, a method for manufacturing a semiconductor memory device comprises: forming a floating gate in a side wall form on a side wall surface of a selection gate on a substrate interposed with a first insulating film; exposing an edge at the top of the floating gate; and rounding the edge to form a round part at the top on the side directed to the side wall surface of the selection gate. Preferably, the edge is disposed at the top of the floating gate on the side directed to the side wall surface of the selection gate.

In the method for manufacturing a semiconductor memory device, it is preferred that a selection gate be formed on a substrate via (interposed with) the first insulating film; a second insulating film, a third insulating film, a fourth insulating film, and a fifth insulating film be formed on the selection gate in order from bottom to top; a second semiconductor film be deposited over a sixth insulating film on a substrate of which the surface is entirely covered with the sixth insulating film; and a floating gate be formed in the side wall form by etching back at least the fifth insulating film; the fourth insulating film, the third insulating film, the second insulating film, the selection gate, and the side wall surface of the second insulating film are formed in the forming of the floating gate; and the fifth insulating film and the fourth insulating film be removed in the exposing of the edge.

It is preferred that the method for manufacturing a semiconductor memory device further comprises, before forming the floating gate: forming a first insulating film, a first semiconductor film, a second insulating film, a third insulating film, a fourth insulating film, and a fifth insulating film on the substrate in order from bottom to top; and forming a selection gate by selectively etching the fifth insulating film, the fourth insulating film, the third insulating film, the second insulating film, the first semiconductor film, and the first insulating film in predetermined regions, and forming a sixth insulating film on the entire surface of the substrate. The method further comprises, between the forming of the floating gate and the exposing of the edge: forming first and second diffusion regions on the surface of the substrate by ion implantation in a self alignment manner using the sixth insulating film and the floating gate as a mask, and burying a seventh insulating film in the first and second diffusion regions and between the neighboring floating gates. The method further comprises, after the forming of the round part: forming an eighth insulating film on the entire surface of the substrate, and forming a control gate on the eighth insulating film.

In the method for manufacturing a semiconductor memory device, it is preferred that the round part at the top of the floating gate be formed by plasma etching.

According to a third aspect of the present invention, a semiconductor memory device comprises a selection gate provided in a first region on a substrate, a floating gate provided in a second region adjacent to the first region, first and second diffusion regions provided in a third region adjacent to the second region and a control gate provided over the floating gate, and the floating gate is formed in the side wall form on a side wall surface of the selection gate and has a round part at the top of the floating gate. Preferably, the round part is disposed at the top on the side directed to the side wall surface of the selection gate.

The meritorious effects of the present invention are summarized as follows.

According to the present invention (claims 1 to 12), an electric field concentrating on the area between a floating gate and a control gate is relaxed by rounding the edge of the floating gate, and the extraction of electrons from the floating gate during a read operation can be prevented.

BRIEF DESCRIPTIONS OF THE DRAWINGS

PREFERRED EMBODIMENTS OF THE INVENTION

Embodiment 1

Figure 1:
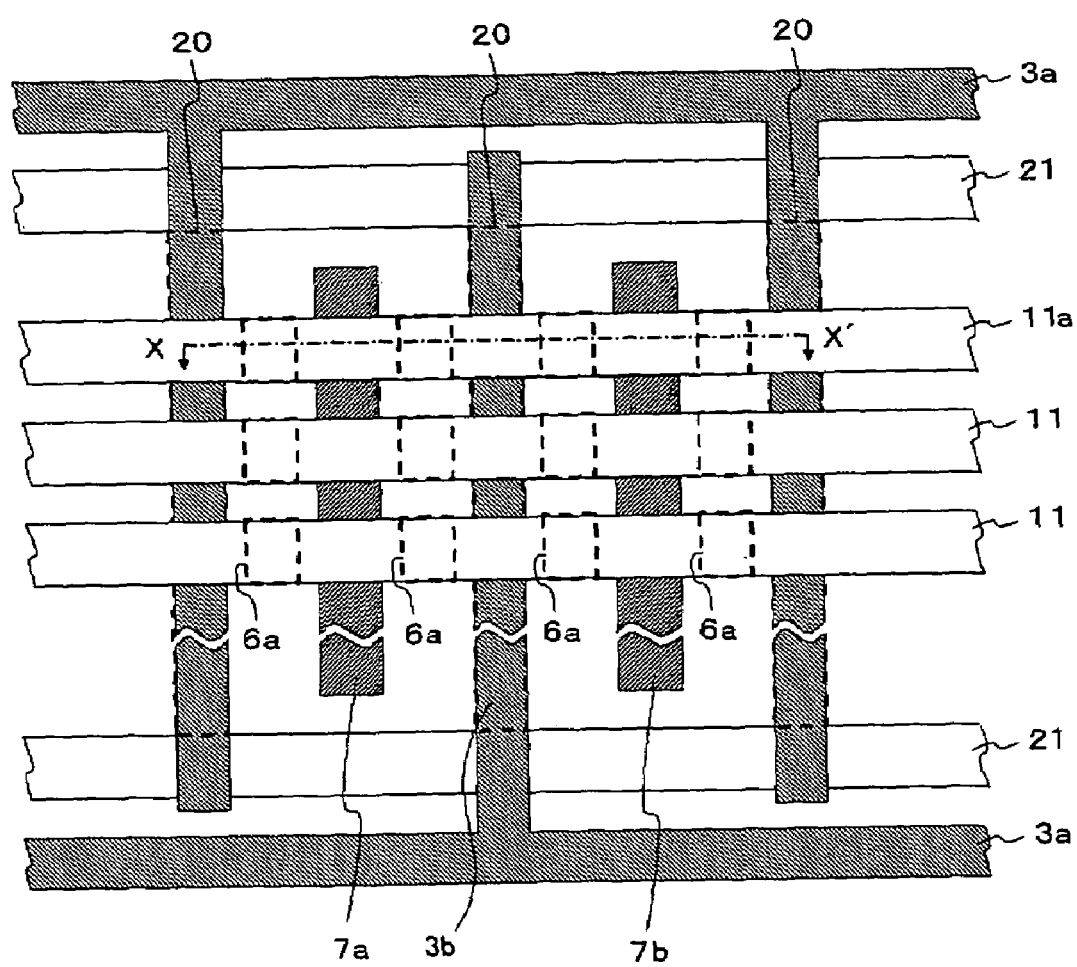
FIG. 1 is a partial plan view schematically showing the structure of a semiconductor memory device relating to Embodiment 1 of the present invention.
Figure 2:
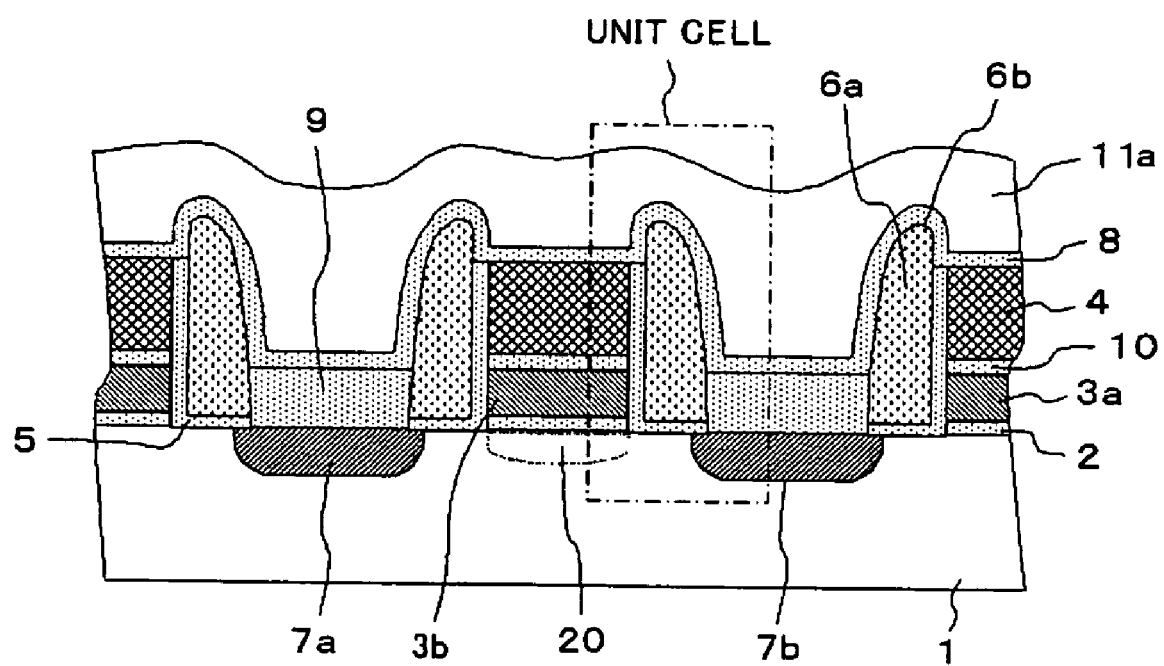
FIG. 2 is a partial cross sectional view taken along line X-X' of FIG. 1 schematically showing the structure of the semiconductor memory device relating to Embodiment 1 of the present invention.

A semiconductor memory device relating to Embodiment 1 of the present invention will be described with reference to the drawings. FIG. 1 is a partial plan view schematically showing the structure of the semiconductor memory device relating to Embodiment 1 of the present invention. FIG. 2 is a partial cross sectional view taken along line X-X' of FIG. 1 schematically showing the structure of the semiconductor memory device relating to Embodiment 1 of the present invention.

The semiconductor memory device relating to Embodiment 1 is a nonvolatile semiconductor memory device storing two-bit information per cell. The semiconductor memory device comprises a substrate 1, an insulating film 2, a selection gate 3a, an insulating film 10, an insulating film 4, an insulating film 5, a floating gate 6a, a first diffusion region 7a, a second diffusion region 7b, an insulating film 8, an insulating film 9, a control gate 11, and a third diffusion region 21 (refer to FIGS. 1 and 2). As indicated by single-dot chain line in FIG. 1, a unit cell in the semiconductor memory device is made up by one second diffusion region 7b (or first diffusion region 7a), one floating gate 6a, the control gate 11, and the selection gate 3a. A two-bit cell in the semiconductor memory device is formed by disposing two unit cells having the selection gate 3a in common line-symmetrically.

The substrate 1 is a P-type silicon substrate (refer to FIGS. 1 and 2). The insulating film 2 (for instance a silicon oxide film) is provided between a selection gate 3a and the substrate 1 as a selection gate insulating film (refer to FIG. 2).

The selection gate 3a is a conductive film (for instance a polysilicon film) provided over the insulating film 2 (refer to FIGS. 1 and 2). Looking from the direction of the normal line to the plane, the selection gate 3a has a plurality of comb tooth-shaped portions extending from the common lines (the horizontal lines in FIG. 1). The comb tooth-shaped portions of one selection gate 3b are disposed between those of the other selection gate 3a at a predetermined interval so that they intermeshingwise alternate with each other.

The insulating film 10 is an insulating film (for instance a silicon oxide film) provided over the selection gate 3a (refer to FIG. 2). The insulating film 4 is an insulating film (for instance a silicon nitride film) provided over the insulating film 10 (refer to FIG. 2). The insulating film 5 is a tunnel insulating film (for instance a silicon oxide film) provided between the floating gate 6b on the one hand, and the side walls of the insulating film 10 and the insulating film 4, the side walls of the first selection gate 3a and the second selection gate 3b, and the side wall of the insulating film 2 on the other hand, as well as between the substrate 1 and the floating gate 6a.

Figure 7:
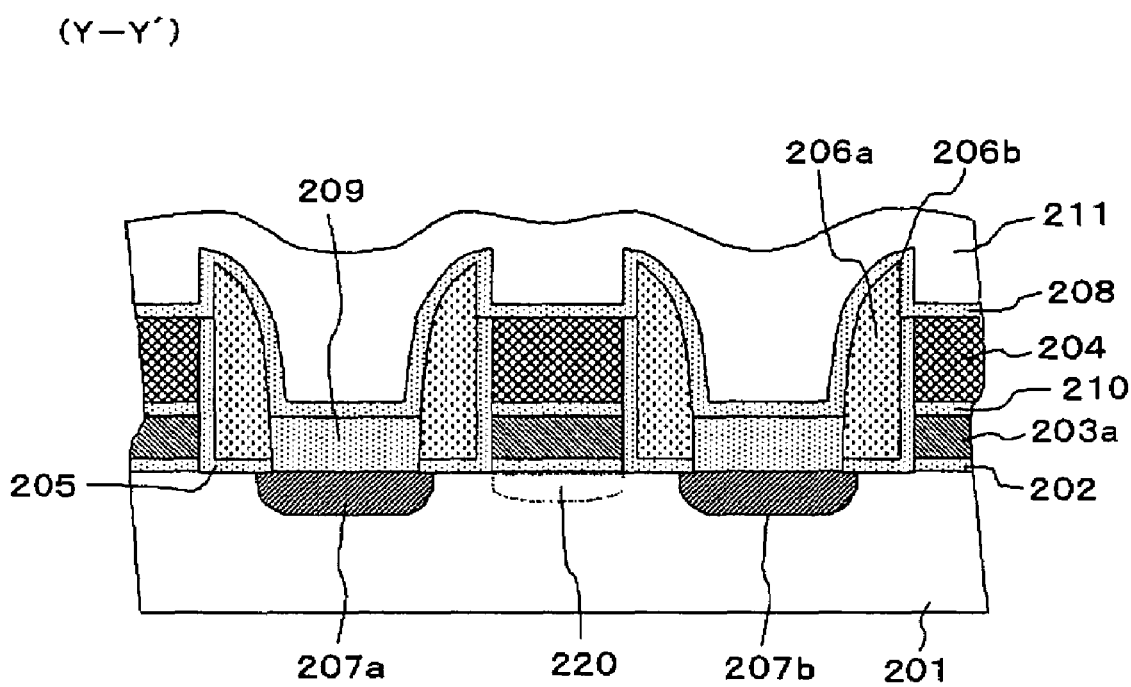
FIG. 7 is a partial cross sectional view taken along line Y-Y' of FIG. 6 schematically showing the structure of the semiconductor memory device relating to Related Art 2.
Figure 8A:
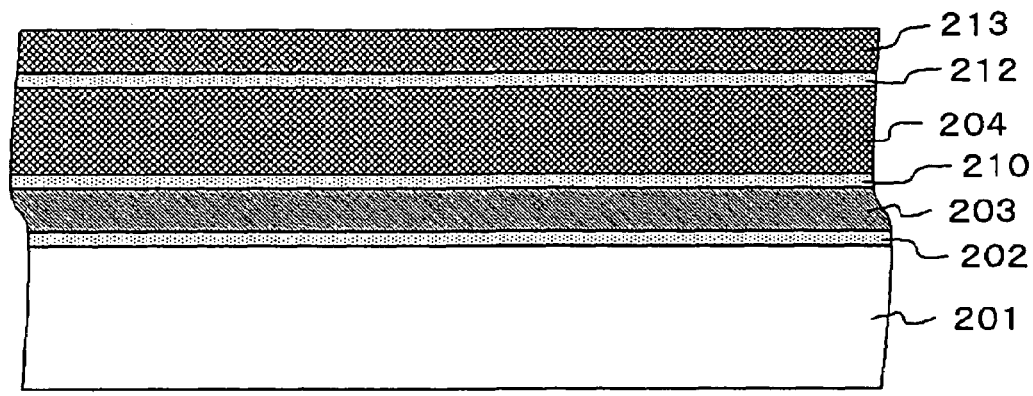
FIGS. 8A to 8C are first cross sectional views schematically showing the process of the method for manufacturing the semiconductor memory device relating to Related Art 2.
Figure 8B:
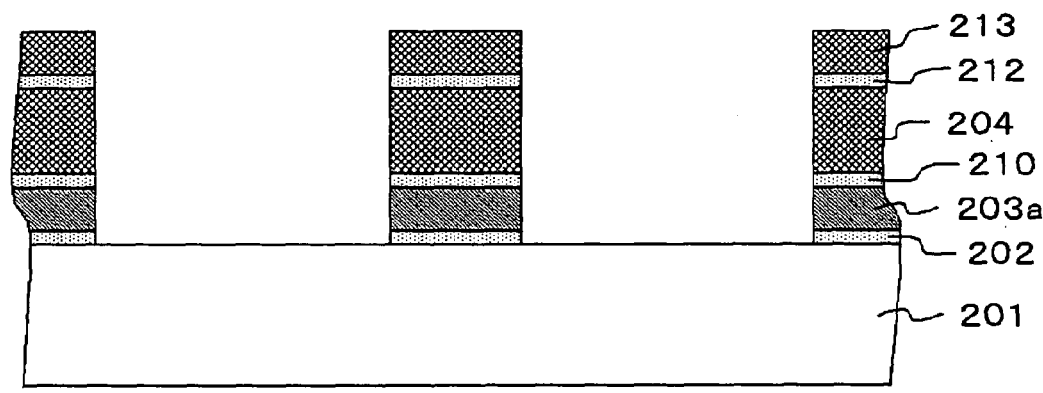
Figure 8C:
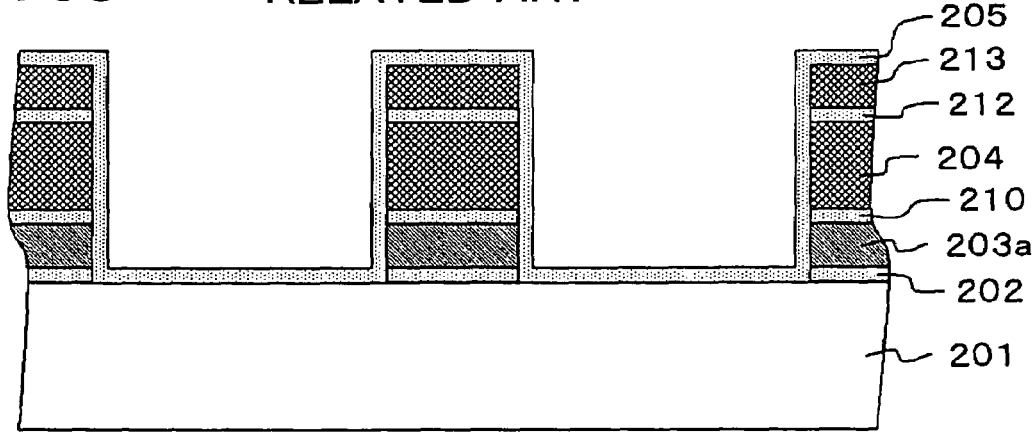
Figure 9D:
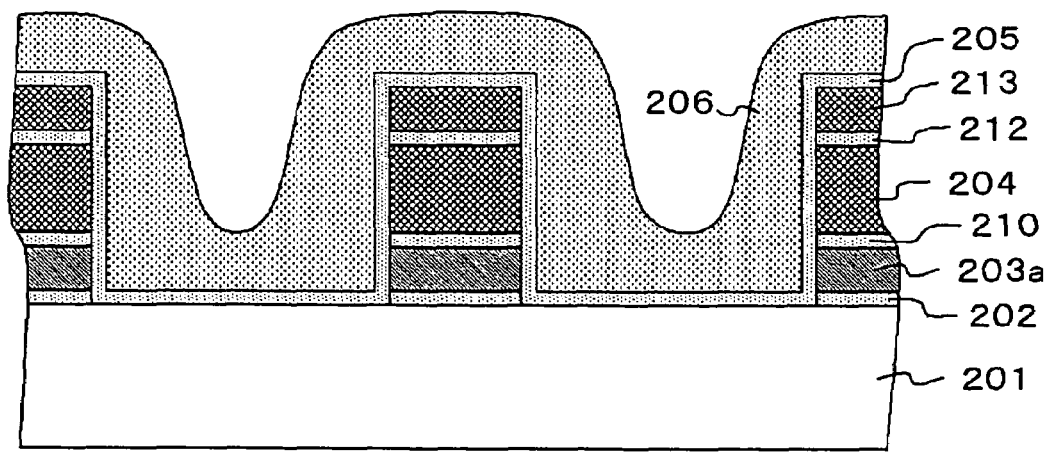
FIGS. 9D to 9F are second cross sectional views schematically showing the process of the method for manufacturing the semiconductor memory device relating to Related Art 2.
Figure 9E:
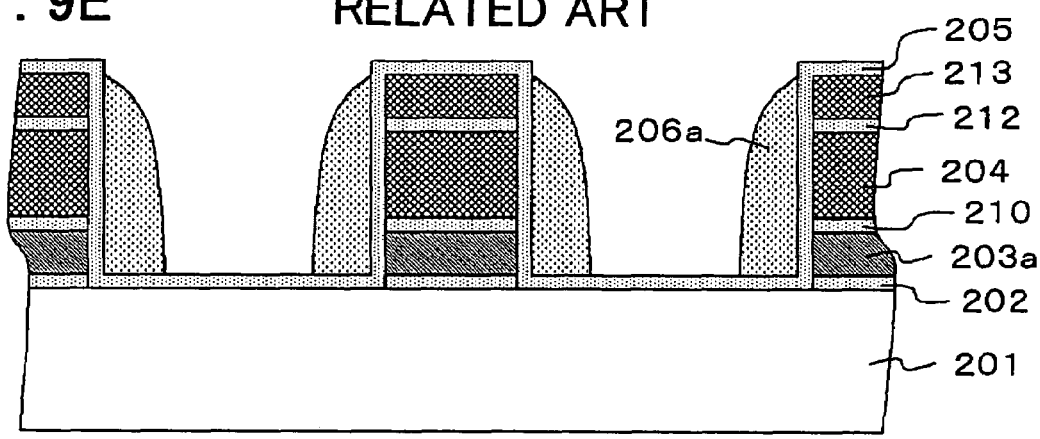
Figure 9F:
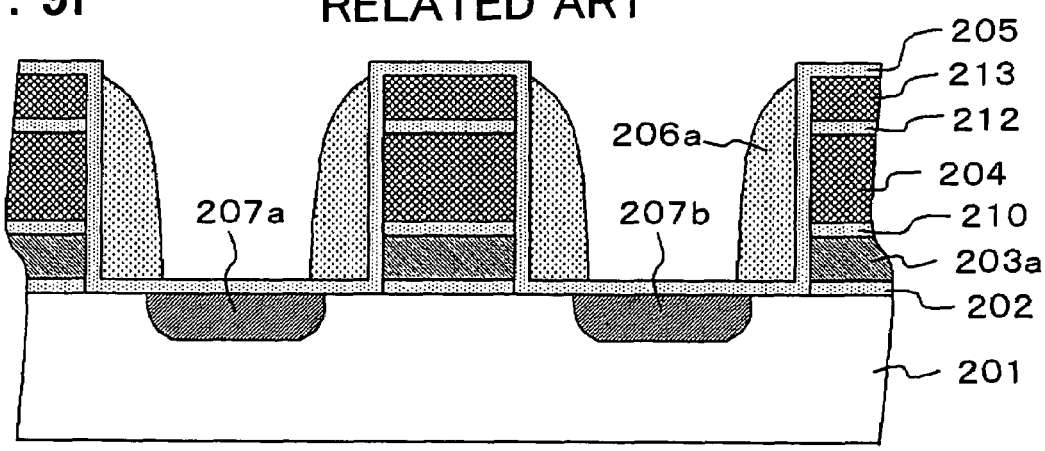
Figure 10G:
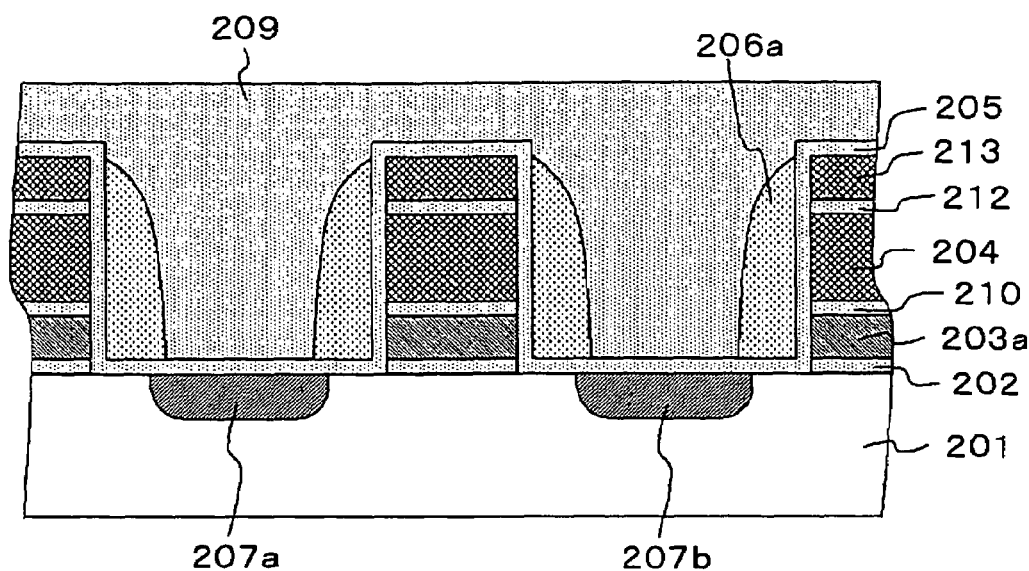
FIGS. 10G to 10I are third cross sectional views schematically showing the process of the method for manufacturing the semiconductor memory device relating to Related Art 2.
Figure 10H:
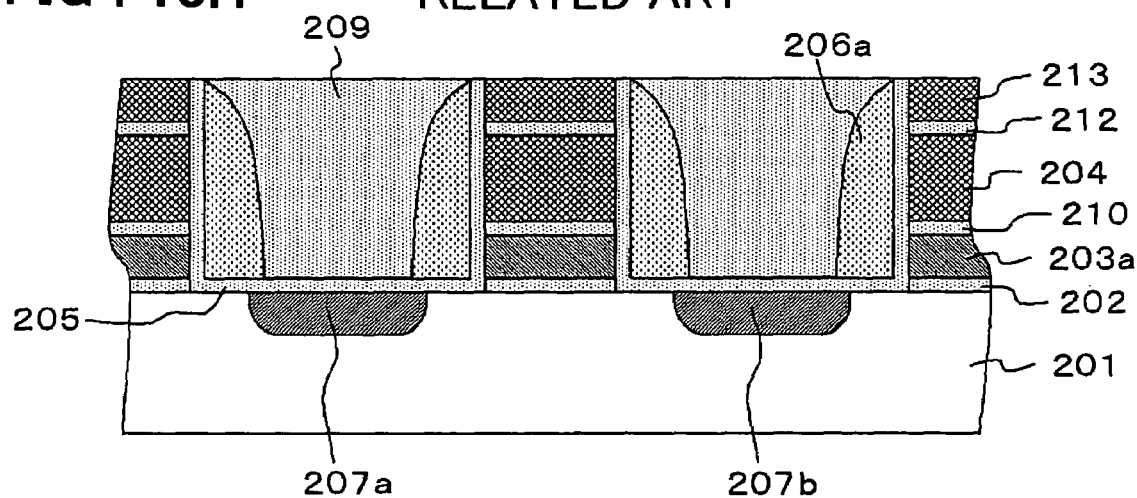
Figure 10I:
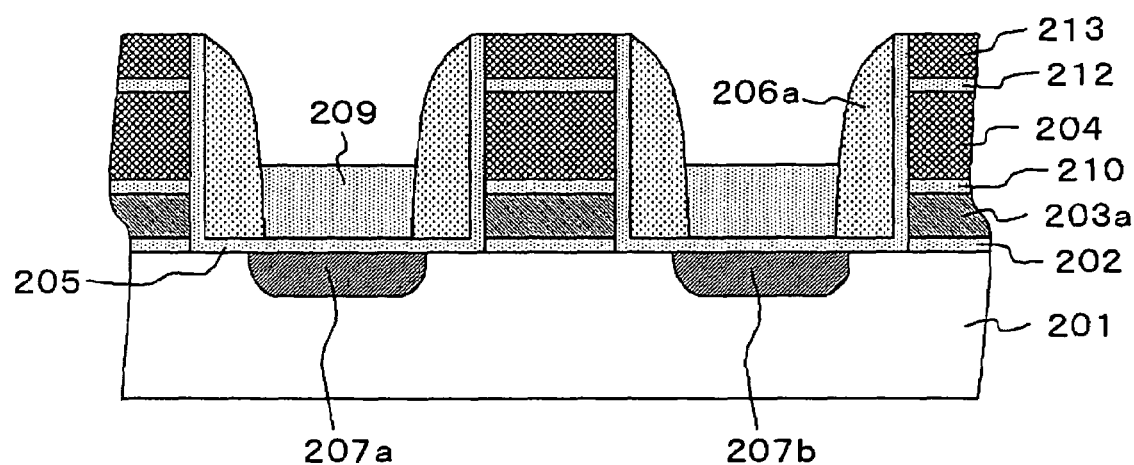
Figure 11J:
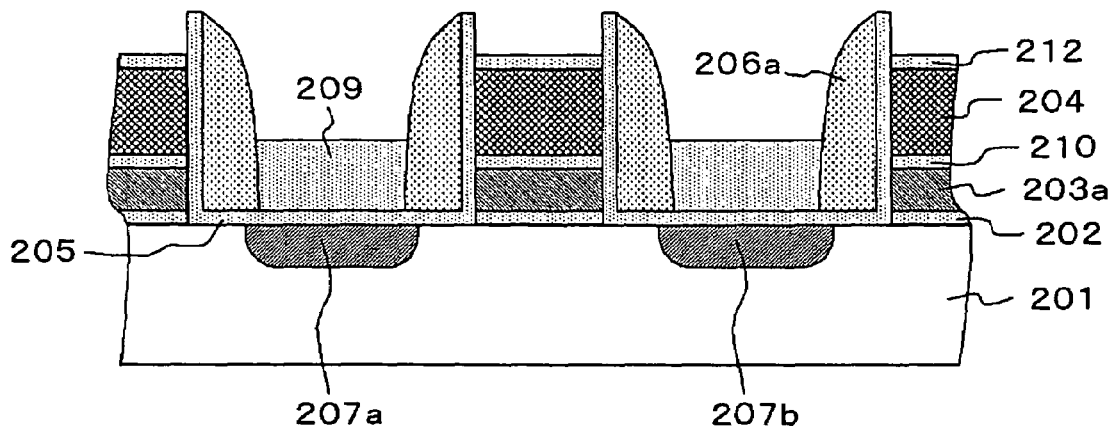
FIGS. 11J to 11L are fourth cross sectional views schematically showing the process of the method for manufacturing the semiconductor memory device relating to Related Art 2.
Figure 11K:
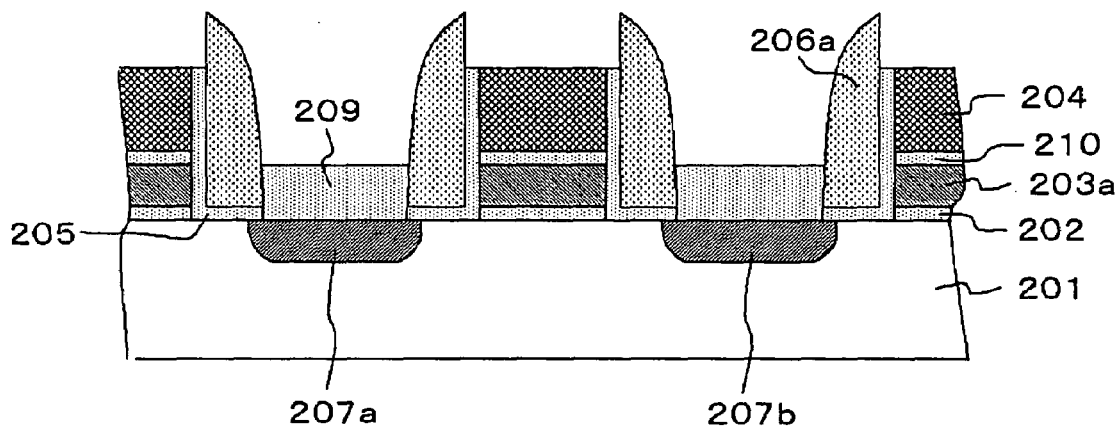
Figure 11L:
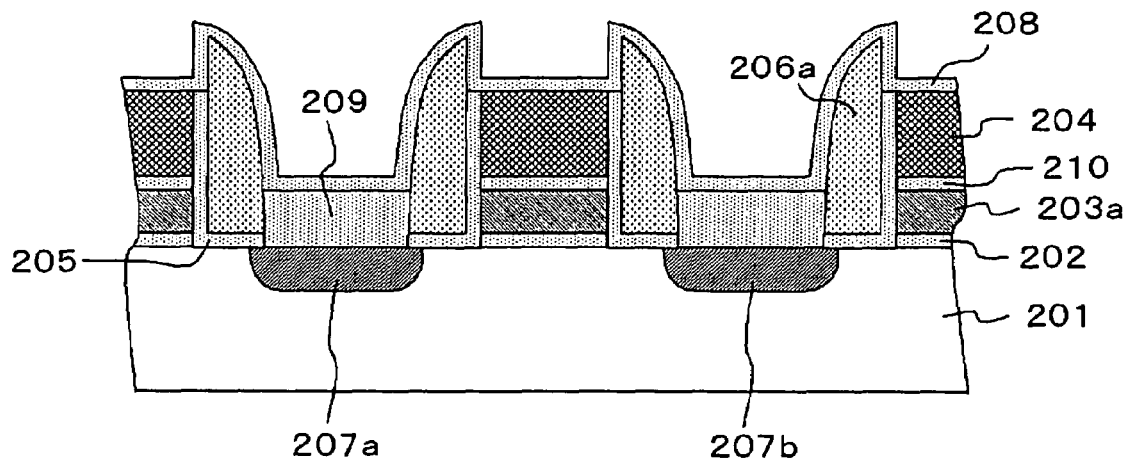
Figure 12:
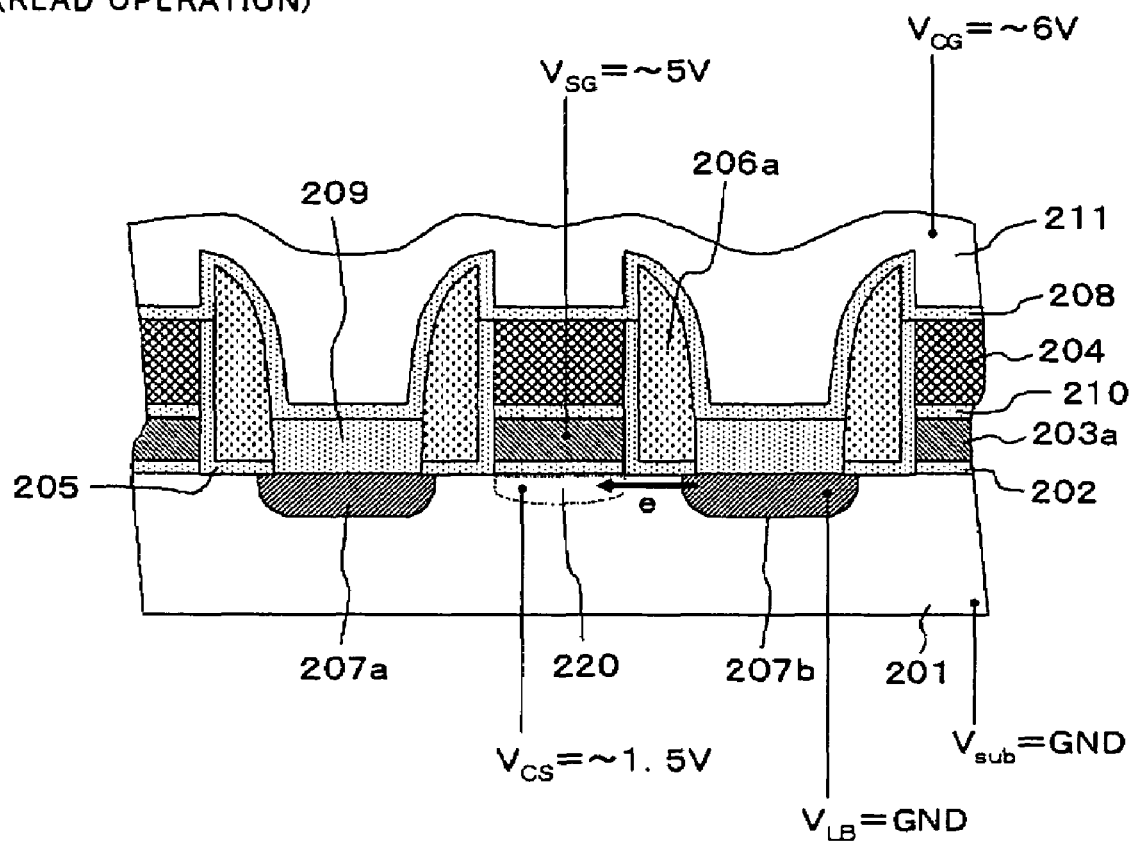
FIG. 12 is a schematic diagram for explaining the read operation of the semiconductor memory device relating to Related Art 2 (the read operation in a state where electrons are not accumulated in the floating gate).
Figure 13:
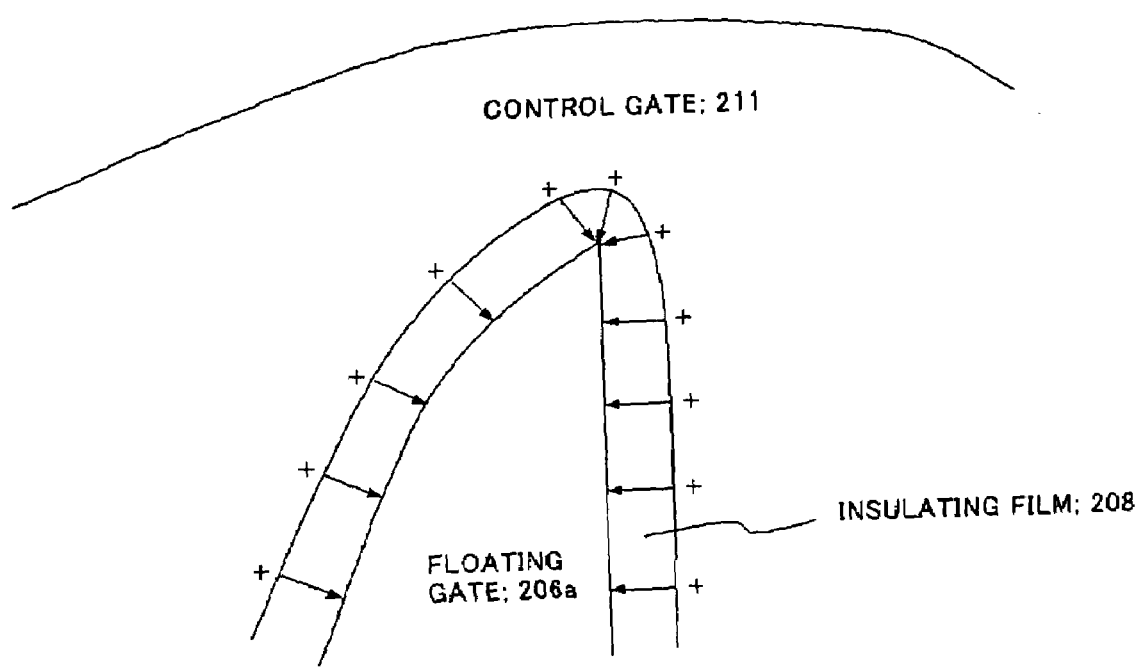
FIG. 13 is a diagram schematically showing a state of the electric field between a control gate and floating gate of the semiconductor memory device relating to Related Art 2.
Figure 14:
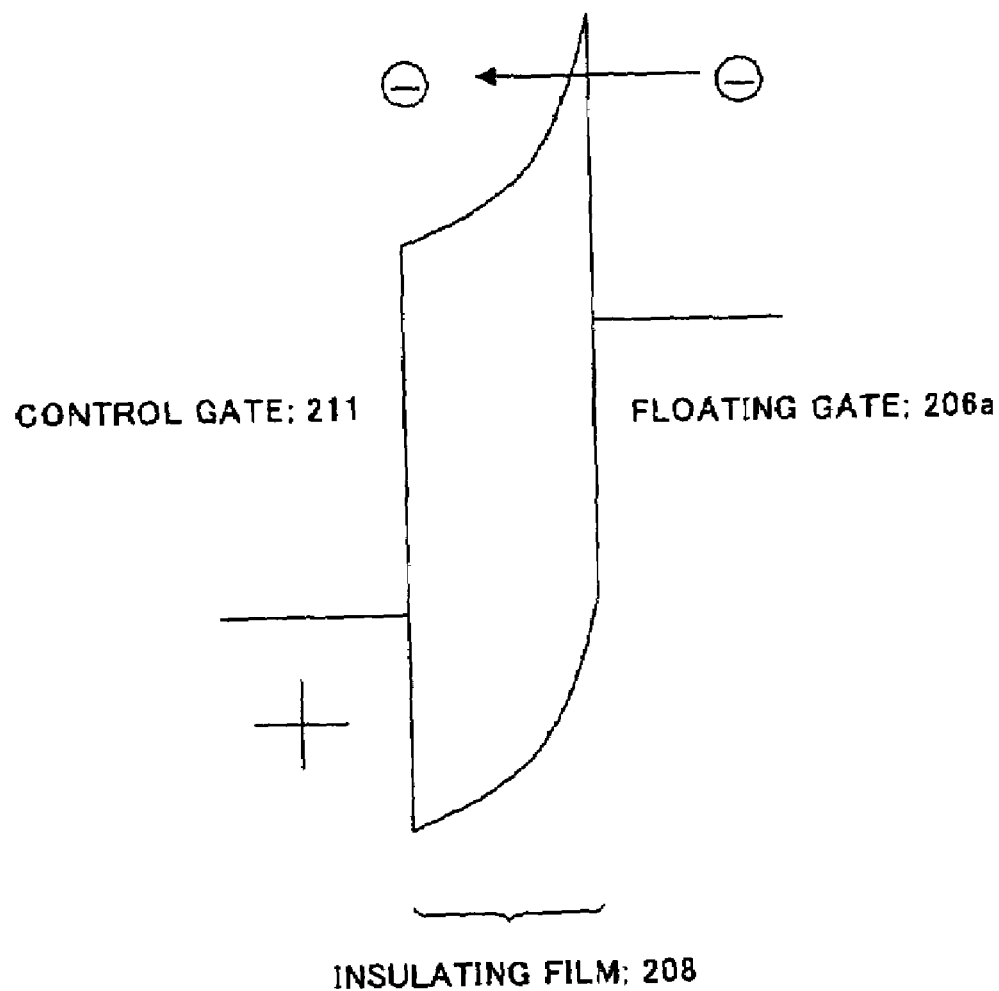
FIG. 14 is a diagram schematically showing a state of the energy band between the control gate and floating gate of the semiconductor memory device relating to Related Art 2.

The floating gate 6a is a storage node and provided on both sides of the selection gate structure made up of a laminated structure of the selection gate 3a, the insulating film 10 and the insulating film 4, via the insulating film 5 on each side (refer to FIGS. 1 and 2). For instance, polysilicon may be used for the floating gate 6a. In the cross sectional view, the floating gate 6a is formed in the form of a side wall and has a round part 6b at the top on the side directed to the side walls of the insulating film 4 (or the selection gate 3a) (refer to FIG. 2). The round part 6b is created by rounding the edge (which corresponds to 206b in FIG. 7) of the floating gate 6a. It is preferable that the curvature radius of the round part 6b be not less than 10 nm. The floating gates 6a are arranged insularly in the plan view (refer to FIG. 1).

The first diffusion region 7a and the second diffusion region 7b are n+ diffusion regions provided in predetermined regions on the substrate 1 (between the neighboring floating gates 6a) and they are disposed along the direction in which the comb tooth-shaped parts of the selection gate 3a extend (refer to FIGS. 1 and 2). The first diffusion region 7a and the second diffusion region 7b become a drain region of the cell transistor during write operations and a source region during read operations because of the relationship with the selection gate 3a. The first diffusion region 7a and the second diffusion region 7b are also termed as local bit lines. The first diffusion region 7a and the second diffusion region 7b have the same impurity concentration.

The insulating film 8 is an insulating film (for instance a silicon oxide film, silicon nitride film, ONO film made up of silicon oxide films having high insulation properties, high relative permittivity (dielectric constant) and suitable for being made thin) provided between the floating gate 6a and the control gate 11a (refer to FIG. 2). The insulating film 9 is an insulating film (for instance a silicon oxide film formed by CVD method or silicon oxide film (thermal oxide film) formed by thermal oxidation) provided between the insulating film 8 and the substrate 1 (the first diffusion region 7a and the second diffusion region 7b) (refer to FIG. 2).

The control gate 11a controls a channel in a region between the selection gate 3a and the first diffusion region 7a (or the second diffusion region 7b). The control gate 11a extends in the direction perpendicular to the comb tooth-shaped portions of the selection gate 3a and intersects with the selection gate 3a (or 3b) at different levels (refer to FIGS. 1 and 2). The control gate 11a abuts on the upper surface of the insulating film 8 provided above the selection gate 3a at the intersection with the selection gate 3a (refer to FIG. 2). The control gate 11a is provided on both sides of the selection gate structure made up of the laminated body of the selection gate 3a, the insulating film 10, and the insulating film 4 via the insulating film 5, the floating gate 6, and the insulating film 8 (refer to FIG. 2). The control gate 11a is made up of a conductive film and for instance a polysilicon film may be used. A high-melting point metal silicide (not shown in the drawings) may be provided on the surface of the control gate 11a in order to reduce resistance.

The third diffusion region 21 is an n+ diffusion region and becomes a source region of the cell transistor during write operations and a drain region during read operations (refer to FIG. 1). The third diffusion region 21 extends in the direction perpendicular to the comb tooth-shaped portions of the selection gate 3a outside the cell region and intersects with the selection gate 3a at different levels. The third diffusion region 21 is formed at the intersection with the selection gate 3a (or 3b), on the surface of the substrate 1 right beneath the insulating film 2 provided below the selection gate 3a (or 3b) (not shown in the drawings).

Note that the write, read and erase operations of the semiconductor memory device of Embodiment 1 are the same as those of Related Art 2.

Figure 3A:
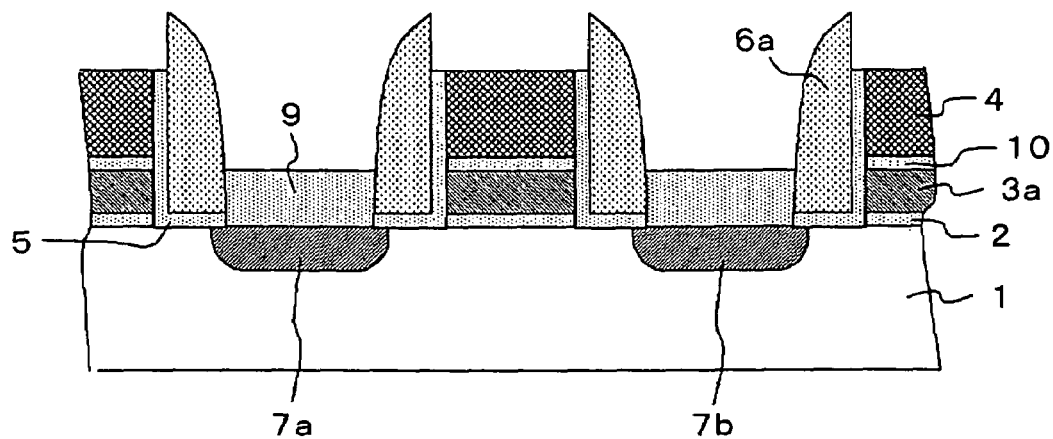
FIGS. 3A to 3C are cross sectional views schematically showing the process of the method for manufacturing the semiconductor memory device relating to Embodiment 1 of the present invention.
Figure 3B:
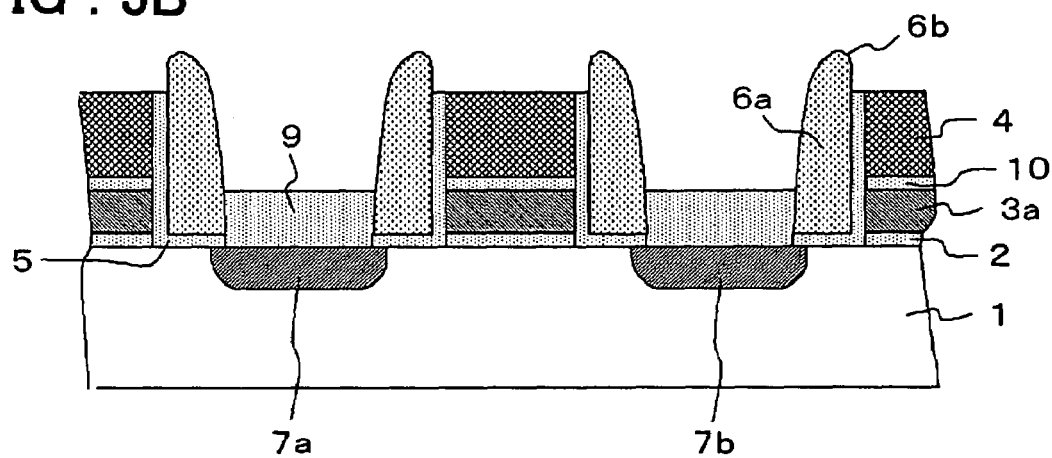
Figure 3C:
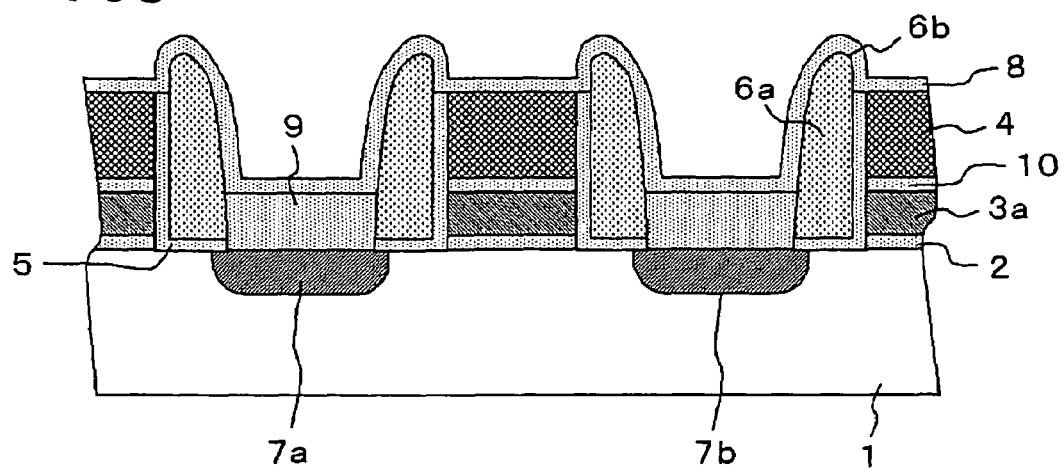

Next, a method for manufacturing the semiconductor memory device relating to Embodiment 1 of the present invention will be described with reference to the drawings. FIGS. 3A to 3C are cross sectional views schematically showing the steps of the method for manufacturing the semiconductor memory device relating to Embodiment 1 of the present invention.

First, a semiconductor memory device shown in FIG. 2A is manufactured (step B1) by performing the steps A1 to A10 of Related Art 2 (refer to FIGS. 8A-8C, 9D-9F, 10G-10I and 11J).

Next, the round part 6b is created by rounding the edge of the floating gate 6a (which corresponds to 206b in FIG. 7) by plasma etching (step Bs; refer to FIG. 3B). For instance, plasma etching can be performed by disposing a wafer (on which the semiconductor memory device shown in FIG. 3A is formed) between an upper electrode on the source side and a lower electrode on the bias side in a chamber under the following conditions: a pressure of 1.33322Pa, an Ar gas flow rate of 50 sccm, a source power of 400 W, a bias power of 200 W, and an etching time of 40 s. Under these conditions, the edge of the floating gate 6a (which corresponds to 206b in FIG. 7) can be rounded concentratedly (targetedly), making the curvature radius of the round part 6b not less than 10 nm.

Next, the insulating film 8 (for instance an ONO film) is formed over the entire surface of the substrate (step B3; refer to FIG. 3C).

Then, a control gate film (for instance a polysilicon film) is deposited over the insulating film 8, a photoresist (not shown in the drawings) for forming a word line is formed, the band-shaped control gate 11 and the insular floating gate 6a are formed by selectively removing the control gate film, the insulating film 8 and the band-shaped floating gate 6a using this photoresist as a mask, then the photoresist is removed step B4; refer to FIG. 2). The semiconductor memory device with the edge of the floating gate 6a (which corresponds to 206b in FIG. 7) rounded as the round part 6b is completed.

Figure 4:
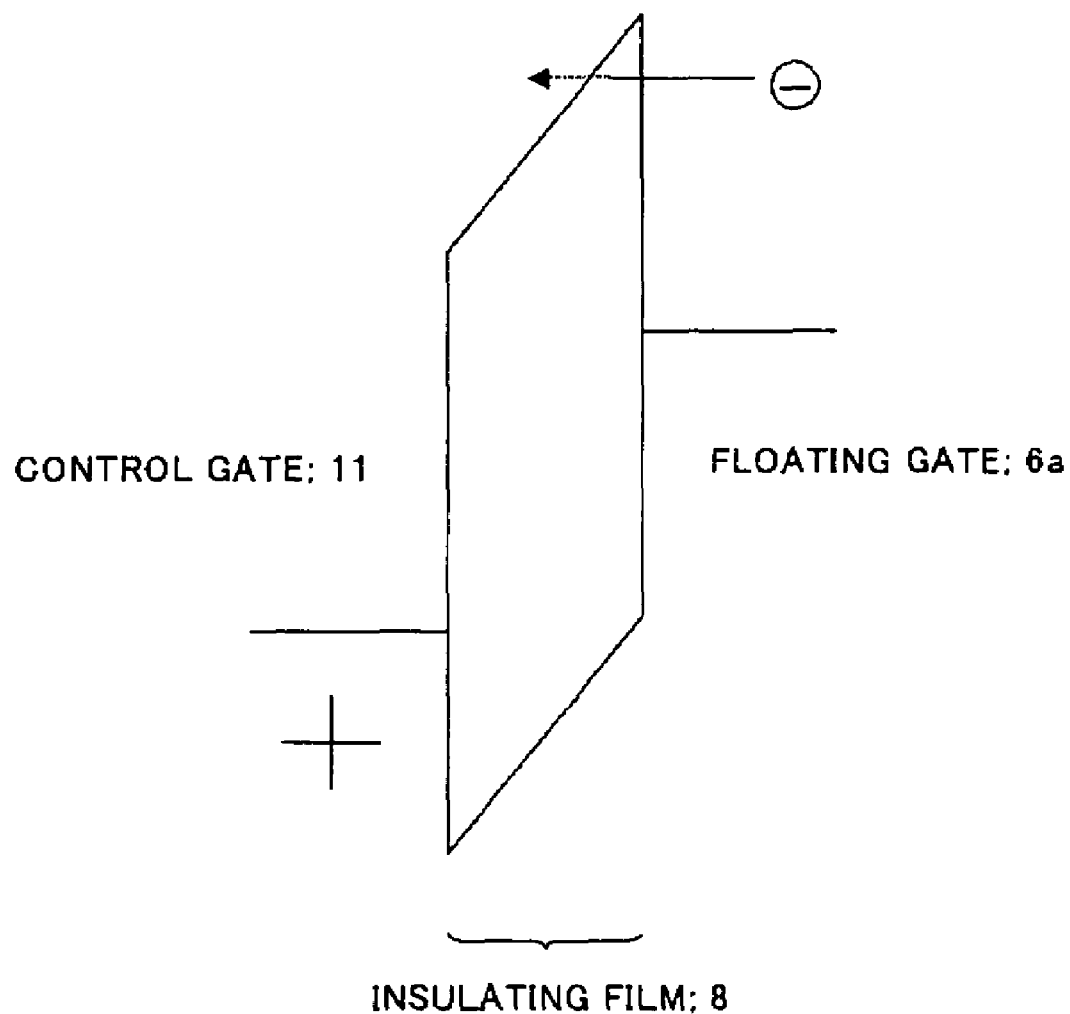
FIG. 4 is a diagram schematically showing a state of the energy band between a control gate and floating gate of the semiconductor memory device relating to Embodiment 1 of the present invention.
Figure 5:
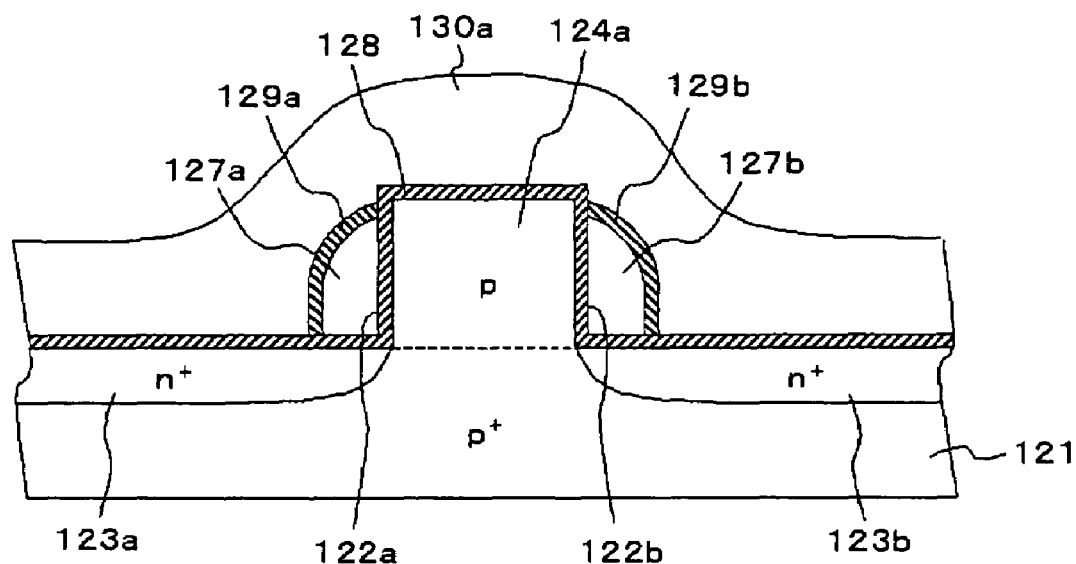
FIG. 5 is a partial cross sectional view schematically showing the structure of a semiconductor memory device relating to Related Art 1.
Figure 6:
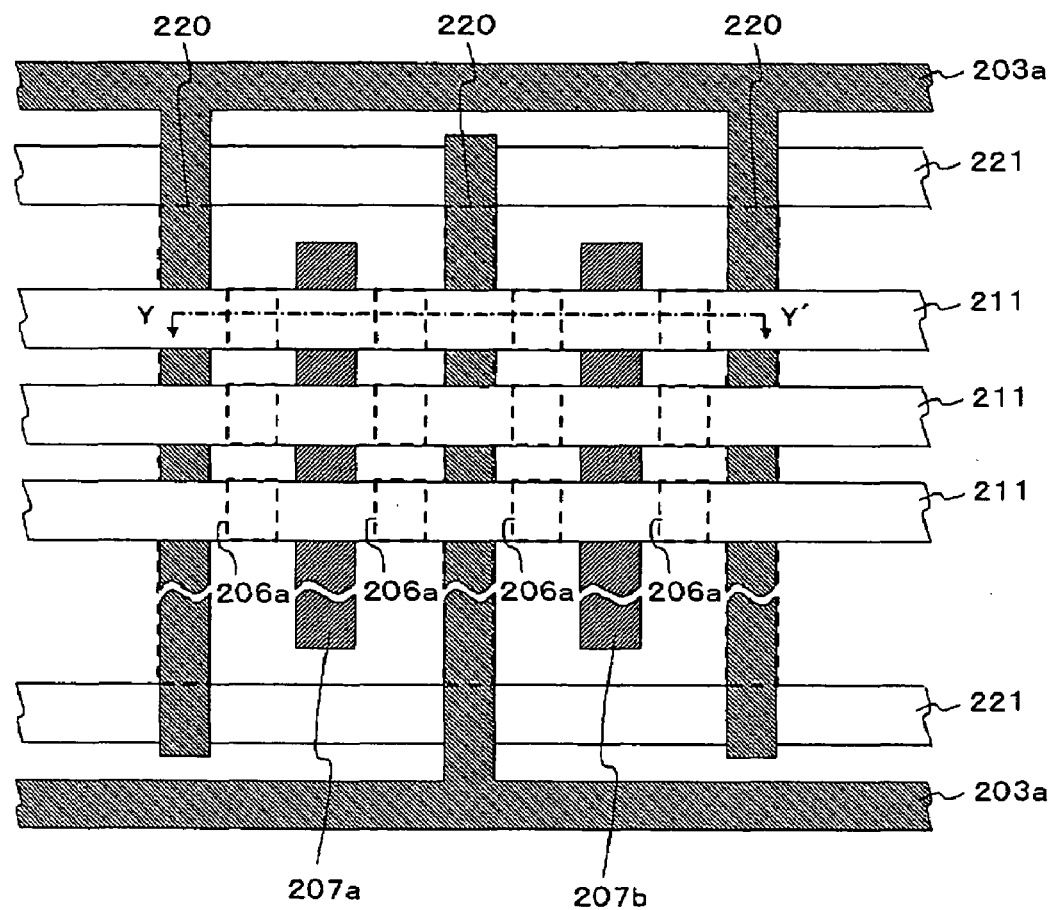
FIG. 6 is a partial plan view schematically showing the structure of a semiconductor memory device relating to Related Art 2.

According to Embodiment 1, by rounding the edge of the floating gate 6a (which corresponds to 206b in FIG. 7) and forming the round part 6b, the electric field does not concentrate on the area between the floating gate 6a and the control gate 11 because of the round part 6b and electrons are not extracted from the floating gate 6a even when a read voltage is applied to the floating gate 11 (refer to FIG. 4). Therefore the operational reliability improves.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a selection gate provided in a first region on a substrate;
a floating gate provided in a second region adjacent to said first region;
first and second diffusion regions provided in a third region adjacent to said second region; and
a control gate provided over said floating gate and a part of said selection gate,
wherein said floating gate is formed in a side wall form on a side wall surface of the selection gate and comprises a round part formed adjacent to said control gate.

2. The semiconductor memory device as defined in claim 1, wherein said round part is on a side directed to a side wall surface of said selection gate.

3. The semiconductor memory device as defined in claim 1, wherein a pair of floating gates are provided in a pair of second regions adjacent to said first region, wherein said first diffusion region and said second diffusion regions are provided in a pair of third regions adjacent to said second regions, respectively, and wherein said control gate is provided over said pair of floating gates, each of which comprises a round part at the top of said floating gates.

4. The semiconductor memory device as defined in claim 1, further comprising:
an insulating layer that insulates said floating gate from the substrate and the selection gate.

5. The semiconductor memory device as defined in claim 1, wherein said round part comprises a curvature radius not less than 10 nm.

6. The semiconductor memory device as defined in claim 1, wherein said round part is formed on a side of said floating gate that faces said control gate.

7. The semiconductor memory device as defined in claim 1, further comprising:
a selection gate insulating film formed between said substrate and said selection gate.

8. The semiconductor memory device as defined in claim 7, further comprising:
a first insulating film formed on said selection gate, and a second insulating film formed on said first insulating film.

9. The semiconductor memory device as defined in claim 8, further comprising:
a third insulating film formed on said second insulating film and between said round part and said control gate.

10. The semiconductor memory device as defined in claim 9, further comprising:
a tunnel insulating film formed between said floating gate, and a side wall of said selection gate, said first insulating film and said second insulating film.

11. The semiconductor memory device as defined in claim 1, wherein said selection gate comprises a plurality of comb tooth-shaped portions.

12. The semiconductor memory device as defined in claim 11, wherein said comb tooth-shaped portions of said selection gate are interlocked with comb tooth-shaped portions of another selection gate.

13. The semiconductor memory device as defined in claim 12, wherein said first and second diffusion regions are disposed along a direction in which said comb tooth-shaped portions extend, and wherein said first and second diffusion regions comprise a drain region during a write operation and a source region during a read operation.

14. The semiconductor memory device as defined in claim 11, wherein said control gate extends in a direction perpendicular to said comb tooth-shaped portions, and controls a channel in a region between said selection gate and said first diffusion region.

15. The semiconductor memory device as defined in claim 1, wherein said round part inhibits an extraction of electrons from said floating gate during a read operation.

16. A semiconductor memory device comprising:
a selection gate provided in a first region on a substrate;
a floating gate provided in a second region adjacent to said first region;
first and second diffusion regions provided in a third region adjacent to said second region; and
a control gate provided over said floating gate,
wherein said floating gate is formed in a side wall form and comprises a round part formed adjacent to said control gate and on the side directed to a side wall surface of said selection gate.

17. The semiconductor memory device as defined in claim 16, wherein a pair of floating gates are provided in a pair of second regions adjacent to said first region, wherein said first diffusion region and said second diffusion regions being provided in a pair of third regions adjacent to said second regions, respectively, and wherein said control gate is provided over said pair of floating gates, each of which comprises a round part at the top of said floating gates.

18. The semiconductor memory device as defined in claim 16, further comprising: an insulating layer that insulates said floating gate from the substrate and the selection gate.

19. The semiconductor memory device as defined in claim 16, wherein said round part comprises a curvature radius not less than 10 nm.

* * * * *